(12) United States Patent
Yang et al.

(10) Patent No.: US 7,570,087 B2
(45) Date of Patent: Aug. 4, 2009

(54) SWITCHING DRIVE CIRCUIT FOR SOFT SWITCHING

(75) Inventors: Ta-Yung Yang, Milpitas, CA (US); Tso-Min Chen, Taichung (TW)

(73) Assignee: System General Corp., Taipei Hsien (TW)

( * ) Notice: Subject to any disclaimer, the term of this patent is extended or adjusted under 35 U.S.C. 154(b) by 160 days.

(21) Appl. No.: 11/723,989

(22) Filed: Mar. 23, 2007

(65) Prior Publication Data
US 2008/0232138 A1    Sep. 25, 2008

(51) Int. Cl.
*H03K 3/00* (2006.01)
(52) U.S. Cl. .................. 327/110; 327/423; 327/588
(58) Field of Classification Search .......... 327/110, 327/423, 588
See application file for complete search history.

(56) References Cited

U.S. PATENT DOCUMENTS

| | | | |
|---|---|---|---|
| 5,140,591 A * | 8/1992 | Palara et al. ............ | 327/109 |
| 6,107,844 A * | 8/2000 | Berg et al. .............. | 327/110 |
| 6,486,714 B2 * | 11/2002 | Ushida et al. .......... | 327/108 |
| 6,580,627 B2 * | 6/2003 | Toshio .................... | 363/98 |
| 6,847,532 B2 * | 1/2005 | Villaret ................... | 363/132 |
| 6,940,262 B2 * | 9/2005 | Dequina et al. ........ | 323/284 |
| 7,151,406 B2 * | 12/2006 | Labbe .................... | 330/251 |
| 7,158,390 B2 * | 1/2007 | Choi et al. .............. | 363/17 |

* cited by examiner

*Primary Examiner*—Kenneth B. Wells
(74) *Attorney, Agent, or Firm*—Rosenberg, Klein & Lee

(57) ABSTRACT

A switching drive circuit for soft switching is disclosed. It includes an input circuit to receive an input signal. A first delay circuit generates a first delay time in response to the enable of the input signal. A second delay circuit generates a second delay time in response to the disable of the input signal. A switching signal generator generates switching signals. The pulse width of the high-side switching signal is generated in proportion to the pulse width of the input signal. The high-side switching signal enabled after the first delay time once the input signal is enabled. The low-side switching signal disabled in response to the enable of the input signal. The low-side switching signal is enabled after the second delay time once the high-side switching signal is disabled.

15 Claims, 6 Drawing Sheets

SWITCHING DRIVE CIRCUIT FOR SOFT SWITCHING

BACKGROUND OF THE INVENTION

1. Field of Invention

The present invention relates to switching power circuits, and more particularly to switching drive circuit for power converters or inverters.

2. Description of Related Art

A switching power circuit normally includes switching devices to drive inductive devices and/or a transformer. The switching devices connected to the transformer control energy transfer from the primary winding to the secondary winding of the transformer. The switching power circuit operates at high frequencies and allows a size and weight reduction. However, the switching losses, component stresses, and electric magnetic interference (EMI) are inherent problems. In order to reduce the switching losses, the popular phase-shift schemes of soft switching have been proposed for high frequency power conversion. Among them, the full-bridge (FB) quasi-resonant zero voltage switching (ZVS) technique are described in following prior arts: "Constant frequency resonant power converter with zero voltage switching" by Christopher, P. Henze, Ned Mohan, and John G. Hayes, U.S. Pat. No. 4,855,888; "Soft-switching PWM converters" by Guichao C. Hua and Fred C. Lee, U.S. Pat. No. 5,442,540; The active clamp techniques are disclosed for forward ZVS power converters such as: "Double forward converter with soft-PWM switching" by F. Don Tan, U.S. Pat. No. 5,973,939; for the half-bridge (HB) topology, an asymmetrical schemes is developed for ZVS, "Asymmetrical power converter and method of operation thereof" by Rui Liu, U.S. Pat. No. 6,069,798. In various ZVS converters, the parasitic leakage inductance of the transformer or additional magnetic components are employed as a resonant inductance or switches to generate the circulating current for achieving the zero voltage transition and switching.

FIG. 1 shows a full-bridge phase-shift switching power circuit. Switches 10, 20, 30 and 40 develop a full-bridge circuit. Switches 10 and 30 are connected to an input voltage $V_{IN}$. Switches 20 and 40 are coupled to the ground. Controlling the on time of switches 10, 20 or controlling the on time of switches 30, 40 will regulate the power delivered to a load 50. An inductor 55 coupled in series with the load 50 will produce a circulating current to achieve soft switching. A high-side drive signal $V_A$ controls the on/off of the switch 10. A high-side switching signal $S_A$ generates the high-side drive signal $V_A$ through a high-side driver 12. A capacitor 15 and a diode 17 form a charge pump circuit to provide the power source to the high-side driver 12. The diode 17 is coupled to a terminal VCC to receive a regulated power source. The capacitor 15 is coupled to the diode 17 and the high-side driver 12.

Another high-side drive signal $V_C$ controls the switch 30. A high-side switching signal $S_C$ generates the high-side drive signal $V_C$ through a high-side driver 32. A capacitor 35 and a diode 37 develop another charge pump circuit to supply the power source to the high-side driver 32. The diode 37 is coupled to the terminal VCC to receive the regulated power source. The capacitor 35 is coupled to the diode 37 and the high-side driver 32. A low-side drive signal $V_B$ controls the switch 20. A low-side switching signal $S_B$ generates the low-side drive signal $V_B$ via a low-side driver 22. A low-side drive signal $V_D$ controls the switch 40. A low-side switching signal $S_D$ generates the low-side drive signal $V_D$ through another low-side driver 42. The low-side drivers 22 and 42 are coupled to the terminal VCC and the ground.

The object of the present invention is to provide a simple and economic solution to accomplish the soft switching. A switching drive integrated circuit is developed to generate drive signals $V_A$, $V_B$, $V_C$, $V_D$ in response to an input signal, such as a PWM (Pulse Width Modulation) signal. A general and low-cost PWM controller such as 3842 can be used to generate the PWM signal.

SUMMARY OF THE INVENTION

A switching drive circuit is developed for soft switching. It includes an input circuit to receive an input signal. A first delay circuit generates a first delay signal with a first delay time in response to the enable of the input signal. A second delay circuit generates a second delay signal with a second delay time in response to the disable of the input signal. A switching signal generator generates switching signals. The pulse width of the high-side switching signal is generated in proportion to the pulse width of the input signal. The high-side switching signal is enabled after the first delay time once the input signal is enabled. The low-side switching signal is disabled in response to the enable of the input signal. The low-side switching signal is enabled after the second delay time once the high-side switching signal is disabled. The switching drive circuit further includes a first delay terminal and a second delay terminal for programming the value of the first delay time and the second delay time respectively. A first resistor is coupled to the first delay terminal to determine the value of the first delay time. A second resistor is coupled to the second delay terminal to determine the value of the second delay time. Furthermore, the switching drive circuit provides a regulated power source to the low-side diver. The regulated power source is further coupled to charge pump circuit through an output terminal of the switching drive circuit to supply the power to the high-side driver.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
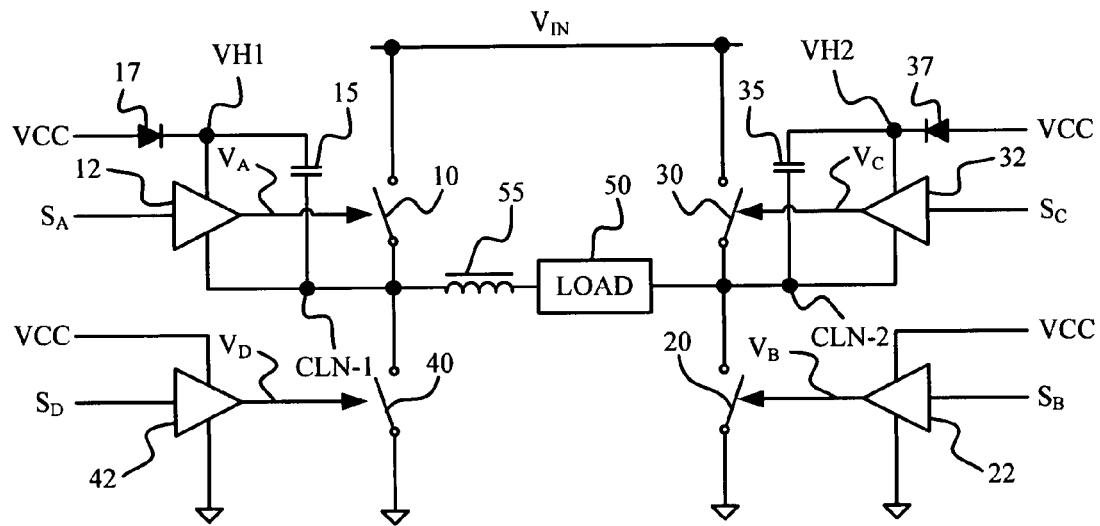
FIG. 1 shows a circuit diagram of a full-bridge phase-shift switching power circuit of the prior art.

FIG. 2A through 2E illustrate five operational stages of the switching power circuit according to the invention. The switching power circuit comprises switches 10, 20, 30 and 40. The first terminals of the switches 10 and 30 are connected to an input voltage $V_{IN}$. The second terminals of the switches 10 and 30 are coupled to an inductor 55 and a load 50 respectively. The inductor 55 is coupled in series with the load 50. The first terminals of the switches 20 and 40 are coupled to the ground. The second terminals of the switches 20 and 40 are coupled to the load 50 and the inductor 55 respectively. Controlling the on time of switches 10, 20 or controlling the on time of switches 30, 40 will regulate the power delivered to the load 50. The switches 10, 20, 30 and 40 are controlled by a high-side drive signal $V_A$, a low-side drive signal $V_B$, a high-side drive signal $V_C$ and a low-side drive signal $V_D$ respectively. The high-side drive signals $V_A$, $V_C$ and the low-side drive signals $V_B$, $V_D$ are generated in response to high-side switching signals $S_A$, $S_C$ and low-side switching signals $S_B$, $S_D$ respectively (shown in FIG. 5). Diodes 11, 21, 31 and 41 are parasitic devices of switches 10, 20, 30 and 40 respectively.

Figure 2A:
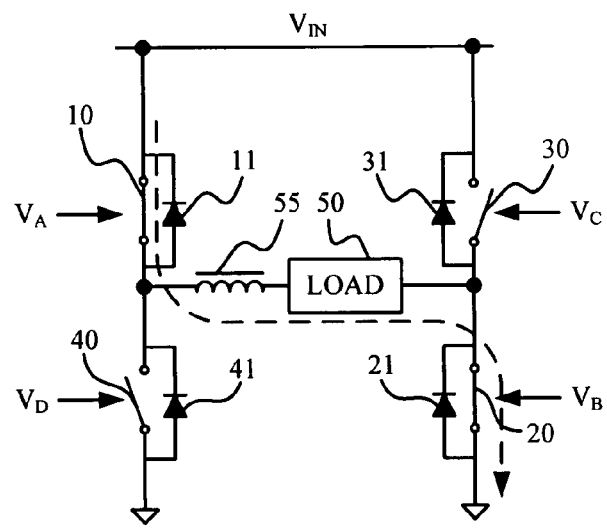
FIG. 2A through 2E illustrate five operational stages of the switching power circuit in accordance with the present invention.
Figure 2B:
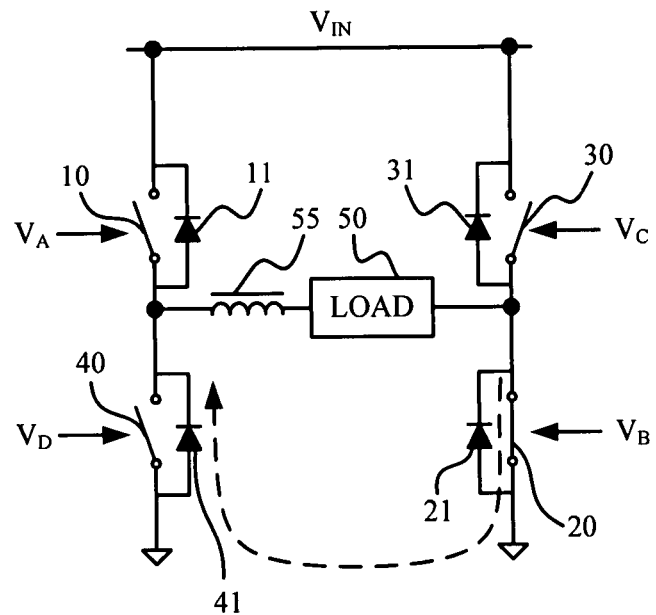
Figure 2C:
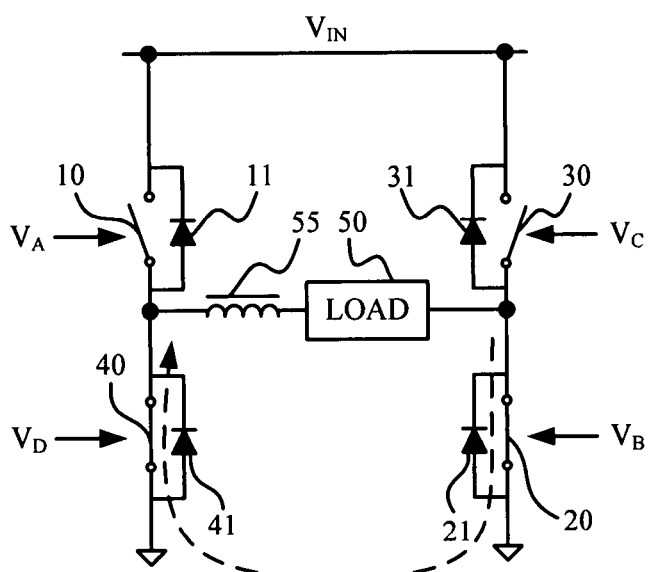
Figure 2D:
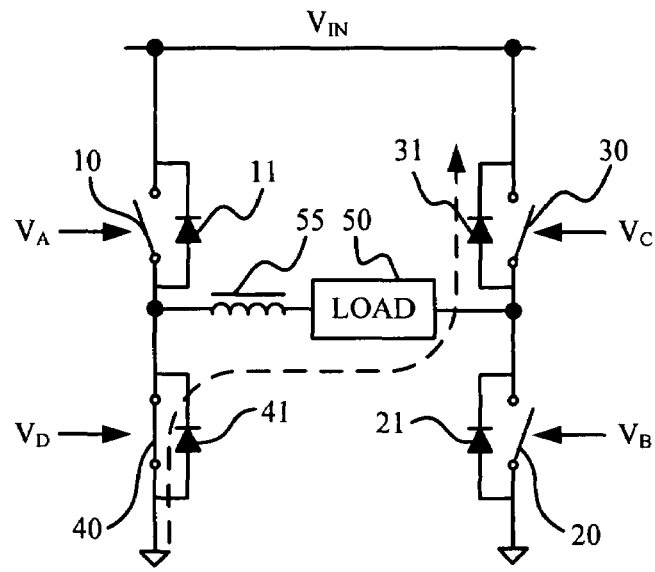
Figure 2E:
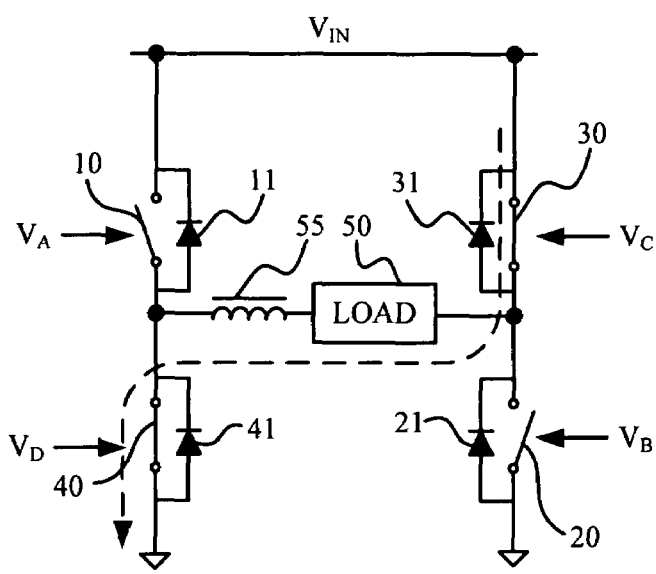

FIG. 2A shows the first operational stage W1, switches 10 and 20 are switched on to transfer the energy from the input voltage $V_{IN}$ to the load 50 through the inductor 55. The second operational stage W2, when the switch 10 is switched off as shown in FIG. 2B, the magnetized energy of the inductor 55 will generate a circulating current. This circulating current will turn on the diode 41 after a quasi-resonant delay $T_{Q\text{-}LOW\text{-}SIDE}$. Meanwhile, the switch 40 will be turned on to achieve the soft switching of the switch 40 as shown in FIG. 2C. FIG. 2C is the third operational stage W3. Before the turn-on of the switch 30, the switch 20 is switched off in advance. FIG. 2D shows the fourth operational stage W4, the energy of the inductor 55 is circulated to the switch 30 once the switch 20 is tuned off. The diode 31 will be turned on after another quasi-resonant delay $T_{Q\text{-}HIGH\text{-}SIDE}$. At that time, the switch 30 should be turned on immediately to achieve the soft switching as shown in FIG. 2E. FIG. 2E is the fifth operational stage W5. In order to turn on the diodes 31 and 41 for achieving the soft switching of the switches 30 and 40, the parasitic capacitor of the switch must be fully discharged firstly.

The criterion for achieving the transition is given by, $$L_{55} \times Ip^2 > Cj \times Vin^2$$

where $L_{55}$ is the inductance of the inductor 55; Ip is the switching current through inductor 55; Cj is the capacitance of the parasitic capacitor; $V_{IN}$ is the input voltage. Since the resonant frequency is fr. The fr is given by, $$Fr = \frac{1}{2\pi \sqrt{Cj \times L_{55}}}$$

A delay time to achieve the phase shift for soft switching is given by, $$T_D = 1/(4 \times fr)$$
$$= \frac{\pi \sqrt{Cj \times L_{55}}}{2}$$

The delay time $T_D$ represents the quasi-resonant delay $T_{Q\text{-}LOW\text{-}SIDE}$ and the quasi-resonant delay $T_{Q\text{-}HIGH\text{-}SIDE}$.

Figure 3:
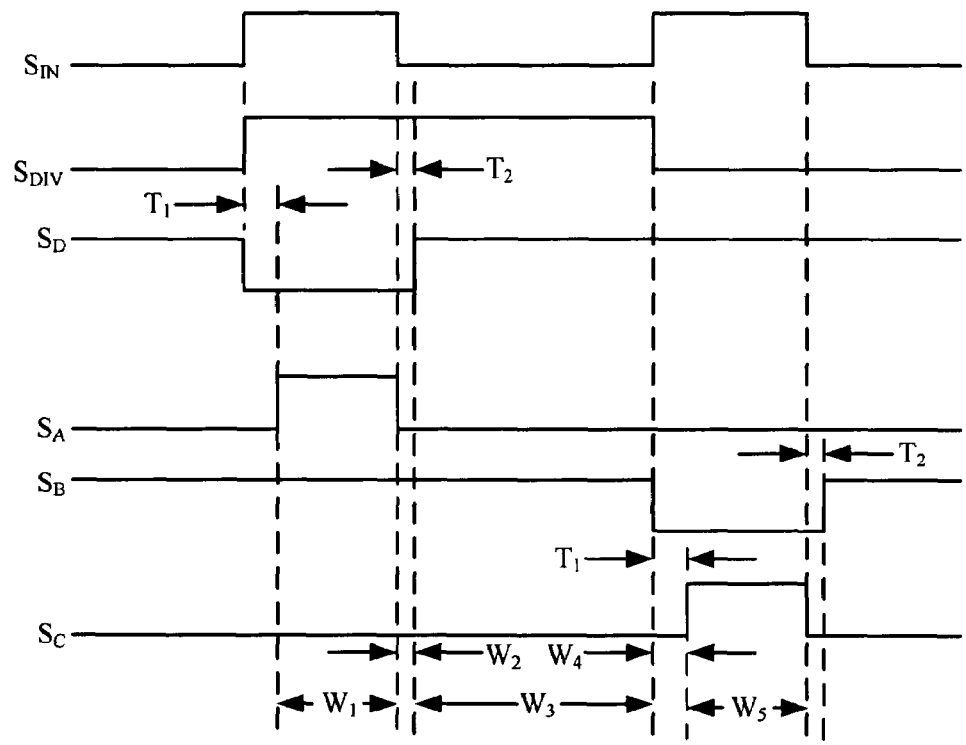
FIG. 3 shows switching signals waveform of five operational stages in accordance with the present invention.

FIG. 3 shows switching signals waveform of five operational stages in accordance with the present invention. A first delay time $T_1$ is generated between the disable of the low-side switching signal $S_D$ and the enable of the high-side switching signal $S_A$. The first delay time $T_1$ is also generated between the disable of the low-side switching signal $S_B$ and the enable of the high-side switching signal $S_C$. The first delay time $T_1$ must meet the criterion of the quasi-resonant delay $T_{Q\text{-}HIGH\text{-}SIDE}$. A second delay time $T_2$ is generated between the disable of the high-side switching signal $S_A$ and the enable of the low-side switching signal $S_D$. The second delay time $T_2$ is also needed to be produced between the disable of the high-side switching signal $S_C$ and the enable of the low-side switching signal $S_B$. The second delay time $T_2$ has to satisfy the criterion of the quasi-resonant delay $T_{Q\text{-}LOW\text{-}SIDE}$.

Figure 4:
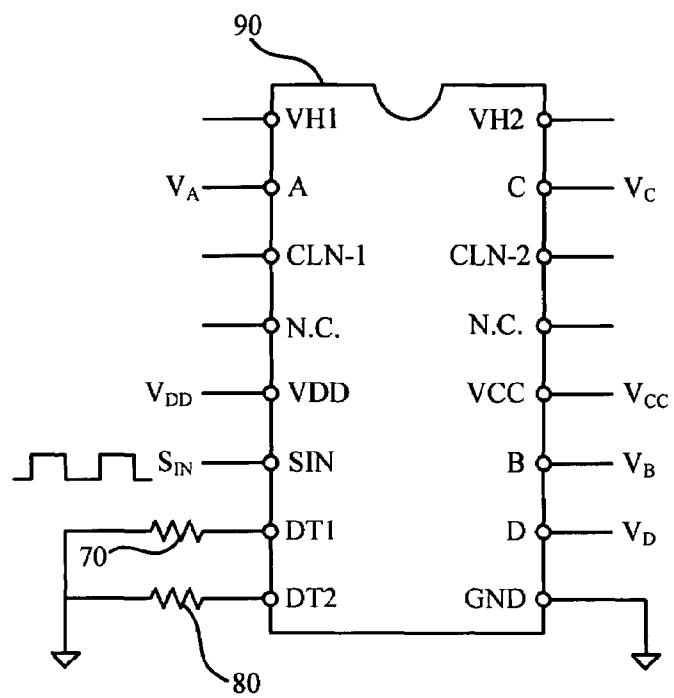
FIG. 4 shows a switching drive integrated circuit in accordance with the present invention.

FIG. 4 shows a switching drive integrated circuit 90. An input terminal SIN receives an input signal $S_{IN}$. The input signal $S_{IN}$ can be a PWM (Pulse Width Modulation) signal. A general and low-cost PWM controller such as 3842 can be used to generate the PWM signal. A first high-side driver terminal A generates the high-side drive signal $V_A$ in response to the input signal $S_{IN}$. A second high-side driver terminal C generates the high-side drive signal $V_C$ in response to the input signal $S_{IN}$ as well. A first low-side driver terminal B generates the low-side drive signal $V_B$ in response to the input signal $S_{IN}$. A second low-side driver terminal D also generates the low-side drive signal $V_D$ in response to the input signal $S_{IN}$. The pulse width of the high-side drive signals $V_A$ and $V_C$ are generated in proportion to the pulse width of the input signal $S_{IN}$. The high-side drive signal $V_A$ or $V_C$ is enabled after the first delay time $T_1$ once the input signal $S_{IN}$ is enabled. The low-side drive signal $V_B$ or $V_D$ is disabled in response to the enable of the input signal $S_{IN}$. The low-side drive signal $V_B$ or $V_D$ is enabled after the second delay time $T_2$ once the high-side drive signal $V_A$ or $V_C$ is disabled.

A first delay terminal DT1 is used for programming the value of the first delay time $T_1$. A second delay terminal DT2 is used for programming the value of the second delay time $T_2$. A first resistor 70 is coupled to the first delay terminal DT1 to determine the value of the first delay time $T_1$. A second resistor 80 is coupled to the second delay terminal DT2 to determine the value of the second delay time $T_2$. An output terminal VCC is utilized to provide a regulated power source $V_{CC}$ from an input power source $V_{DD}$ of an input power source terminal VDD. The regulated power source $V_{CC}$ is coupled to charge pump circuits (shown in FIG. 1). Power terminals VH1 and CLN-1 are coupled to supply power to a high-side driver 12 (shown in FIG. 5). Power terminals VH2 and CLN-2 are coupled to supply power to a high-side driver 32 (shown in FIG. 5). Two N.C. (no connection) terminals provide safety space in between the high voltage circuits and the low voltage circuits. A ground terminal GND is coupled to the ground.

Figure 5:
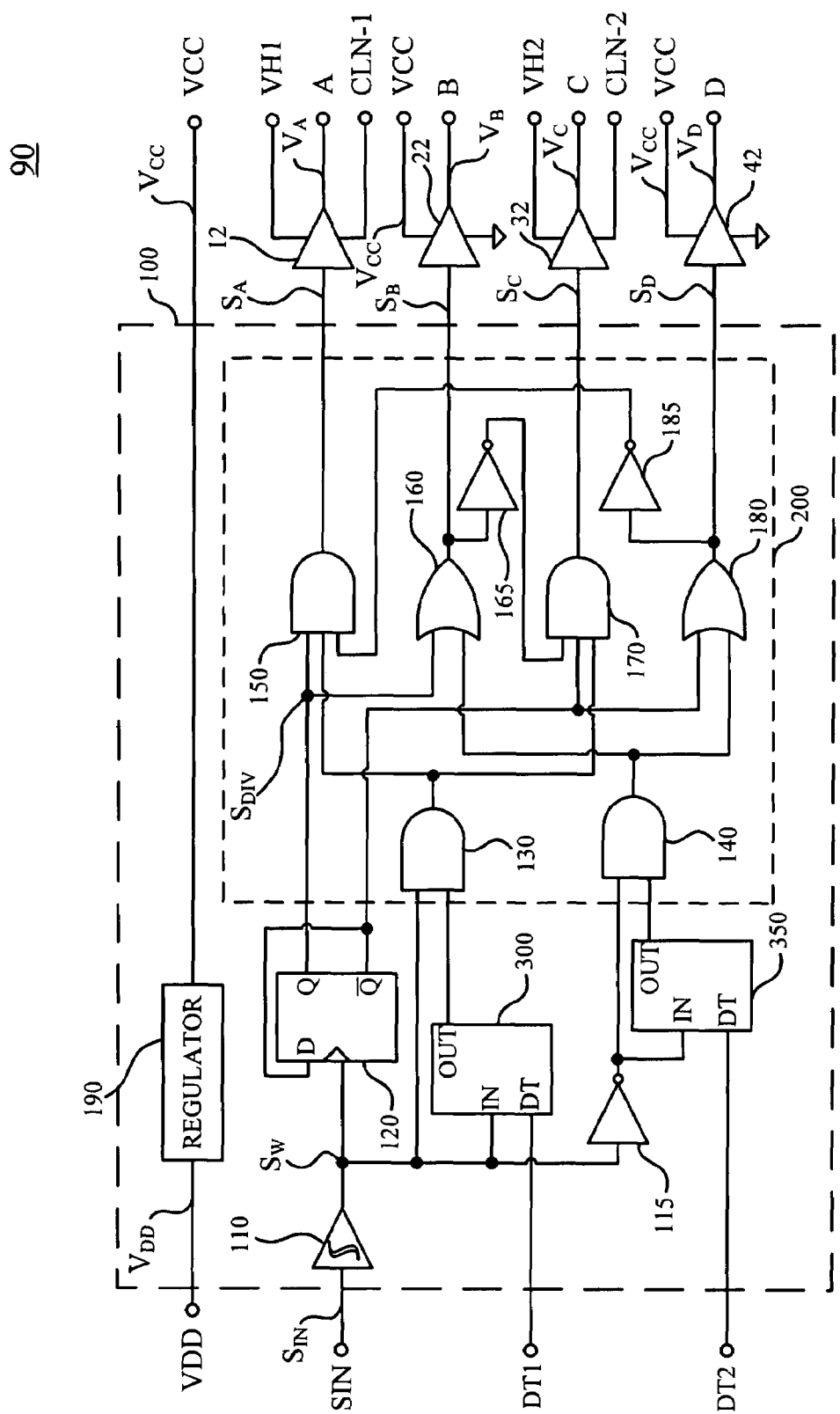
FIG. 5 shows a preferred embodiment of the circuit diagram of the switching drive integrated circuit in accordance with the present invention.

FIG. 5 shows a circuit diagram of the switching drive integrated circuit 90 in FIG. 4. An input circuit 110 operated as Schmitt-trigger buffer is applied to receive the input signal $S_{IN}$. The input circuit 110 generates a buffer signal $S_W$ in response to the input signal $S_{IN}$. A flip-flop 120 is connected to operate as a divide-by-two circuit. The buffer signal $S_W$ is connected to the flip-flop 120 to generate a divided signal $S_{DIV}$. The buffer signal $S_W$ is further coupled to a first delay circuit 300 to generate a first delay signal with the first delay time $T_1$ in response to the enable of the input signal $S_{IN}$. The first delay signal and the buffer signal $S_W$ are connected to an AND gate 130 to produce a high-side enable signal. The buffer signal $S_W$ is further coupled to a second delay circuit 350 via an inverter 115 to generate a second delay signal with the second delay time $T_2$ in response to the disable of the input signal $S_{IN}$. The second delay signal and the output signal of the inverter 115 are connected to an AND gate 140 to produce a low-side enable signal.

The switching drive integrated circuit 90 comprises a switching drive circuit 100 including the input circuit 110, the flip-flop 120, the inverter 115, the delay circuits 300, 350, a regulator 190 and a switching signal generator 200 to generate the first switching signal $S_A$, the second switching signal $S_B$, the third switching signal $S_C$ and the fourth switching signal $S_D$. The switching signal generator 200 includes AND gates 130, 140, 150, 170, OR gates 160, 180 and inverters 165, 185. Switching signals $S_A$, $S_C$ are high-side switching signals. Switching signals $S_B$, $S_D$ are low-side switching signals. The input terminal of the inverter 165 is connected to receive the switching signal $S_B$ to invert the switching signal $S_B$. The input terminal of the inverter 185 is connected to receive the switching signal $S_D$ to invert the switching signal $S_D$. The AND gate 150 is coupled to receive the divided signal $S_{DIV}$, the high-side enable signal and the output signal of the inverter 185 for producing the switching signal $S_A$. The AND gate 170 is coupled to receive the inverse signal of the divided signal $S_{DIV}$, the high-side enable signal and the output signal of the inverter 165 for generating the switching signal $S_C$.

The OR gate 160 is coupled to receive the divided signal $S_{DIV}$ and the low-side enable signal for producing the switching signal $S_B$. The OR gate 180 is coupled to receive the inverse signal of the divided signal $S_{DIV}$ and the low-side enable signal to generate the switching signal $S_D$. Therefore, switching signals $S_A$, $S_B$, $S_C$, $S_D$ are generated in response to the input signal $S_{IN}$, the first delay signal, the second delay signal and the divided signal $S_{DIV}$. The pulse width of the switching signal $S_A$ and the switching signal $S_C$ are generated in proportion to the pulse width of the input signal $S_{IN}$.

Referring to FIG. 3 and FIG. 5, when the divided signal $S_{DIV}$ is turned on, the switching signal $S_A$ is enabled after the first delay time $T_1$ once the input signal $S_{IN}$ is enabled. The switching signal $S_D$ is disabled in response to the enable of the input signal $S_{IN}$. The switching signal $S_D$ is enabled after the second delay time $T_2$ once the switching signal $S_A$ is disabled. When the divided signal $S_{DIV}$ is turned off, the switching signal $S_C$ is enabled after the first delay time $T_1$ once the input signal $S_{IN}$ is enabled. The switching signal $S_B$ is disabled in response to the enable of the input signal $S_{IN}$. The switching signal $S_B$ is enabled after the second delay time $T_2$ once the switching signal $S_C$ is disabled.

The switching drive integrated circuit 90 comprises further high-side drivers 12, 32 and low-side drivers 22, 42. The high-side drivers 12, 32 are coupled to receive the high-side switching signals $S_A$ and $S_C$ to generate the high-side drive signals $V_A$, $V_C$ respectively. The low-side drivers 22, 42 are coupled to receive the low-side switching signals $S_B$ and $S_D$ to generate the low-side drive signals $V_B$, $V_D$ respectively. The regulator 190 is connected to the input power source $V_{DD}$ to generate the regulated power source $V_{CC}$. The regulated power source $V_{CC}$ is coupled to the output terminal VCC and connected to the low-side drivers 22 and 42. The output terminal VCC is coupled to the power terminals VH1, CLN-1, VH2 and CLN-2 to supply the power source to the high-side drivers 12 and 32 through the charge-pump circuits (shown in FIG. 1).

Figure 6:
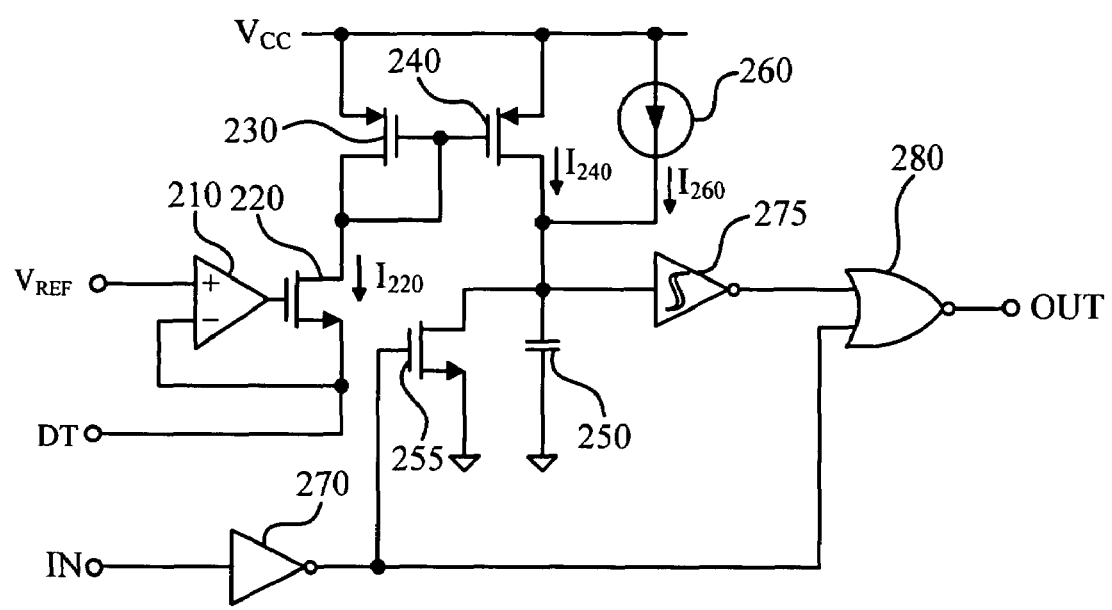
FIG. 6 shows a preferred embodiment of the circuit diagram of a delay circuit in accordance with the present invention.

FIG. 6 shows the circuit diagram of delay circuits 300 and 350 in the FIG. 5. It includes an operational amplifier 210 and a transistor 220 to generate a current $I_{220}$ in accordance with the resistor connected to the delay terminal DT. The delay terminal DT is the first delay terminal DT1 or the second delay terminal DT2 of the FIG. 4. The first resistor 70 (shown in FIG. 4) is connected to the delay terminal DT of the first delay circuit 300 (shown in FIG. 5). The second resistor 80 (shown in FIG. 4) is connected to the delay terminal DT of the second delay circuit 350 (shown in FIG. 5). A reference voltage $V_{REF}$ is connected to the positive input terminal of the operational amplifier 210. The negative input terminal of the operational amplifier 210 is coupled to the delay terminal DT and the source of the transistor 220. The output terminal of the operational amplifier 210 is coupled to the gate of the transistor 220. The drain of the transistor 220 generates the current $I_{220}$.

The current $I_{220}$ is further connected to a current mirror. The current mirror includes transistors 230 and 240 to produce a current $I_{240}$ in accordance with the current $I_{220}$. The current $I_{240}$ and a current $I_{260}$ are used to charge a capacitor 250. A current source 260 generates the current $I_{260}$. A transistor 255 is connected to the capacitor 250 to discharge the capacitor 250. Through an inverter 270, the transistor 255 is connected to the input terminal IN of the delay circuit. An inverter 275 is connected to the capacitor 250 to receive the signal of the capacitor 250. A NOR gate 280 is coupled to the output terminal of the inverter 275 and the output terminal of the inverter 270 for generating an output signal at the output terminal OUT of the delay circuit. The output signal at the output terminal OUT of the delay circuit is therefore generated after a delay time once the input signal at the input terminal IN of the delay circuit is enabled. The delay time is determined by the capacitance of the capacitor 250 and the value of currents $I_{240}$ and $I_{260}$. The current $I_{260}$ determines a maximum value of the delay time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A switching drive circuit for full-bridge switching circuit, comprising:
   an input circuit receiving an input signal;
   a divide-by-two circuit coupled to the input circuit to generate a divided signal in response to the input signal;
   a first delay circuit coupled to the input circuit to generate a first delay signal with a first delay time in response to the enable of the input signal;
   a second delay circuit coupled to the input circuit to generate a second delay signal with a second delay time in response to the disable of the input signal;
   a switching signal generator coupled to the input circuit, the divide-by-two circuit, the first delay circuit and the second delay circuit to generate a first switching signal, a second switching signal, a third switching signal and a fourth switching signal in response to the input signal, the first delay signal, the second delay signal and the divided signal; and
a delay terminal programming a value of the first delay time;
   wherein the pulse width of the first switching signal and the third switching signal are generated in proportion to the pulse width of the input signal, when the divided signal is turned on, the first switching signal is enabled after the first delay time once the input signal is enabled, the fourth switching signal is disabled in response to the enable of the input signal, the fourth switching signal is enabled after the second delay time once the first switching signal is disabled; when the divided signal is turned off, the third switching signal is enabled after the first delay time once the input signal is enabled, the second switching signal is disabled in response to the enable of the input signal, the second switching signal is enabled after the second delay time once the third switching signal is disabled.

2. The switching drive circuit as claimed in claim 1, further comprising a resistor coupled to the delay terminal to determine the value of the first delay time.

3. The switching drive circuit as claimed in claim 1, further comprising a delay terminal for programming a value of the second delay time.

4. The switching drive circuit as claimed in claim 3, further comprising a resistor coupled to the delay terminal to determine the value of the second delay time.

5. The switching drive circuit as claimed in claim 1, further comprising an output terminal to provide a regulated power source coupled to charge pump circuits.

6. The switching drive circuit as claimed in claim 5, wherein the output terminal is coupled a regulator to provide the regulated power source.

7. The switching drive circuit as claimed in claim 1, wherein the input signal can be a PWM (Pulse Width Modulation) signal.

8. A switching drive circuit for switching circuit, comprising:
an input circuit receiving an input signal;
a first delay circuit coupled to the input circuit to generate a first delay signal with a first delay time in response to the enable of the input signal;
a second delay circuit coupled to the input circuit to generate a second delay signal with a second delay time in response to the disable of the input signal;
a switching signal generator coupled to the input circuit, the first delay circuit and the second delay circuit to generate a high-side switching signal and a low-side switching signal; and
at least one delay terminal programming a value of the first delay time or a value of the second delay time;
wherein the pulse width of the high-side switching signal is generated in proportion to the pulse width of the input signal, the high-side switching signal is enabled after the first delay time once the input signal is enabled; the low-side switching signal is disabled in response to the enable of the input signal, the low-side switching signal is enabled after the second delay time once the high-side switching signal is disabled.

9. The switching drive circuit as claimed in claim 8, further comprising a resistor coupled to the delay terminal to determine the value of the first delay time.

10. The switching drive circuit as claimed in claim 8, further comprising a resistor coupled to the delay terminal to determine the value of the second delay time.

11. The switching drive circuit as claimed in claim 8, wherein the input signal can be a PWM (Pulse Width Modulation) signal.

12. A switching drive integrated circuit, comprising:
an input terminal receiving an input signal;
a high-side driver terminal generating a high-side drive signal in response to the input signal;
a low-side driver terminal generating a low-side drive signal in response to the input signal; and
at least one delay terminal programming a value of a first delay time or a value of a second delay time;
wherein the pulse width of the high-side drive signal is generated in proportion to the pulse width of the input signal, the high-side drive signal is enabled after the first delay time once the input signal is enabled; the low-side drive signal is disabled in response to the enable of the input signal, the low-side drive signal is enabled after the second delay time once the high-side drive signal is disabled.

13. The switching drive integrated circuit as claimed in claim 12, further comprising a resistor coupled to the delay terminal to determine the value of the first delay time.

14. The switching drive integrated circuit as claimed in claim 12, further comprising a resistor coupled to the delay terminal to determine the value of the second delay time.

15. The switching drive integrated circuit as claimed in claim 12, wherein the input signal can be a PWM (Pulse Width Modulation) signal.

* * * * *